United States Patent
Ishibashi et al.

(10) Patent No.: US 8,841,215 B2
(45) Date of Patent: Sep. 23, 2014

(54) POLISHING AGENT, COMPOUND SEMICONDUCTOR MANUFACTURING METHOD, AND SEMICONDUCTOR DEVICE MANUFACTURING METHOD

(75) Inventors: Keiji Ishibashi, Itami (JP); Masashi Futamura, Itami (JP); Takayuki Nishiura, Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 13/415,859

(22) Filed: Mar. 9, 2012

(65) Prior Publication Data

US 2012/0164833 A1    Jun. 28, 2012

(30) Foreign Application Priority Data

May 10, 2010 (JP) ................. 2010-108604

(51) Int. Cl.
*H01L 21/302* (2006.01)
*C09G 1/04* (2006.01)
*H01L 21/02* (2006.01)

(52) U.S. Cl.
CPC ........... *H01L 21/02024* (2013.01); *C09G 1/04* (2013.01)
USPC ........ 438/693; 252/79.1; 252/79.2; 252/79.3; 252/79.4; 438/689; 438/690; 438/691; 438/692

(58) Field of Classification Search
USPC .......................... 252/79.1–79.4; 438/689–692
See application file for complete search history.

(56) References Cited

U.S. PATENT DOCUMENTS 8,323,368 B2 *  12/2012  Takakuma et al. .......... 51/309
2007/0075041 A1 *  4/2007  Ishibashi et al. ............ 216/88

FOREIGN PATENT DOCUMENTS

| CN | 1939992 A | 4/2007 |
|---|---|---|
| JP | S59-069932 A | 4/1984 |
| JP | H07-067666 B2 | 7/1995 |
| JP | H07-241763 A | 9/1995 |
| JP | 3147168 B2 | 1/2001 |
| JP | 2004-327614 A | 11/2004 |
| JP | 2007-067153 A | 3/2007 |
| JP | 2007-103463 A | 4/2007 |
| JP | 2008-300422 A | 12/2008 |
| WO | WO-2008-102672 A1 | 8/2008 |

* cited by examiner

*Primary Examiner* — Lan Vinh
*Assistant Examiner* — Maki Angadi
(74) *Attorney, Agent, or Firm* — James W. Judge (57) ABSTRACT

Afforded are a polishing agent, and a compound semiconductor manufacturing method and semiconductor device manufacturing method utilizing the agent, whereby the surface quality of compound semiconductor substrates can be favorably maintained, and high polishing rates can be sustained as well. The polishing agent is a polishing agent for $Ga_\alpha In_{(1-\alpha)} As_\beta P_{(1-\beta)}$ ($0 \leq \alpha \leq 1$; $0 \leq \beta \leq 1$) compound semiconductors, and includes an alkali metal carbonate, an alkali metal organic salt, a chlorine-based oxidizer, and an alkali metal phosphate, wherein the sum of the concentrations of the alkali metal carbonate and the alkali metal organic salt is between 0.01 mol/L and 0.02 mol/L, inclusive. The compound semiconductor manufacturing method comprises a step of preparing a $Ga_\alpha In_{(1-\alpha)} As_\beta P_{(1-\beta)}$ ($0 \leq \alpha \leq 1$; $0 \leq \beta \leq 1$) compound semiconductor, and a step of polishing the face of the compound semiconductor utilizing an aforedescribed polishing agent.

13 Claims, 4 Drawing Sheets

POLISHING AGENT, COMPOUND SEMICONDUCTOR MANUFACTURING METHOD, AND SEMICONDUCTOR DEVICE MANUFACTURING METHOD

CROSS-REFERENCE TO RELATED APPLICATIONS

This Application is a continuation of International Application PCT/JP2010/071104, having an international filing date of Nov. 26, 2010, which claims the benefit of priority of Japanese patent application No. 2010-108604 filed on May 10, 2010, each of which is hereby incorporated by reference in their entirety.

TECHNICAL FIELD

The present invention relates to polishing agents, methods of manufacturing compound semiconductor, and methods of manufacturing semiconductor devices, and more specifically relates to polishing agents for $Ga_\alpha In_{(1-\alpha)}As_\beta P_{(1-\beta)}$ ($0 \leq a < 1$; $0 < 1 < 1$) compound semiconductor, and to compound semiconductor manufacturing methods and semiconductor device manufacturing methods utilizing the agents.

BACKGROUND ART $Ga_\alpha In_{(1-\alpha)}As_\beta P_{(1-\beta)}$ ($0 \leq \alpha \leq 1$; $0 \leq \beta \leq 1$) (hereinafter also referred to as "GaInAsP," gallium indium arsenide phosphide) compound semiconductors find broad application as substrates for growing epitaxial layers that constitute semiconductor microelectronic devices such as semiconductor lasers, LEDs (light-emitting diodes), and high-speed circuit elements. The substrates undergo polishing before the epitaxial layers are formed. Examples of polishing agents employed in such polishing are disclosed in Japanese Pat. No. 3,147,168, (Patent Reference 1), Japanese Unexamined Pat. App. Pub. No. 2004-327614 (Patent Reference 2), Japanese Examined Pat. App. Pub. No. H07-67666 (Patent Reference 3), Japanese Unexamined Pat. App. Pub. No. 2008-300422, and elsewhere.

Abovementioned Patent Reference 1 discloses a polishing agent that contains chlorinated isocyanuric acid, an alkali metal sulfate, an alkali metal phosphate, and an alkali metal carbonate. Abovementioned Patent Reference 2 discloses a polishing agent composed of silica, sodium dichloroisocyanurate, sodium sulphate, sodium tripolyphosphate, sodium carbonate, and citric acid. Abovementioned Patent Reference 3 discloses a polishing agent with chlorinated isocyanuric acid, an alkali metal phosphate, and a sulphate as principal components, wherein the amount fractions are 10 to 40 weight % chlorinated isocyanuric acid, and 60 to 90 weight % alkali metal phosphate and sulphate, with the alkali metal phosphate being present at 0.3 to 2 parts by weight with respect to 1 part by weight sulphate. Abovementioned Patent Reference 4 discloses using, in a first polishing step, a chlorine-based oxidizing agent, and using, in an ensuing second polishing step, an inorganic builder composed of, inter alia, sodium carbonate and sodium tripolyphosphate.

CITATION LIST

Patent Literature

Patent Reference 1: Japanese Pat. No. 3,147,168.
Patent Reference 2: Japanese Unexamined Pat. App. Pub. No. 2004-327614.
Patent Reference 3: Japanese Examined Pat. App. Pub. No. H07-67666.
Patent Reference 4: Japanese Unexamined Pat. App. Pub. No. 2008-300422

SUMMARY OF INVENTION

Technical Problem

The polishing methods employing the polishing agents of the abovementioned Patent References 1 through 4 adopt a chemical polishing process that while oxidizing the substrate face at the same time removes the oxidation layer. With this process sufficiently controlling the action of the polishing agent is difficult. If the oxidizing power of the polishing agent grows too strong, "haze" (surface micro-roughness) in the substrate face increases, while if its alkalinity grows too strong LPDs (light point defects) in the substrate face increase. On the other hand, if the chemical action is too weak, the mechanical action will grow relatively stronger, such that scratching, microroughness, etc. in the substrate face increase. Furthermore, if the chemical action is too weak, the polishing rate (polishing speed) drops.

The fact that preventing deterioration in the surface quality of a post-polished compound semiconductor, and at the same time enhancing the polishing rate have become issues originates in the fact that the action upon one other of the chemical components that constitute the polishing agent has yet to be elucidated. As a result of intensive research efforts, the present inventors arrived at the present invention by ascertaining that the chemical composition of the polishing agent is crucial to resolving the issues discussed above, and furthermore by discovering compositions best-suited to making the resolution of those issues possible.

That is, an object of the present invention is to make available a polishing agent, and a compound semiconductor manufacturing method and semiconductor device manufacturing method utilizing the agent, whereby the surface quality of post-polished compound semiconductor substrates is favorably maintained, and at the same time polishing at a high polishing rate is enabled.

Solution to Problem

A polishing agent of the present invention is a polishing agent for $Ga_\alpha In_{(1-\alpha)}As_\beta P_{(1-\beta)}$ ($0 \leq \alpha \leq 1$; $0 \leq \beta \leq 1$) compound semiconductors, and includes a carbonate of an alkali metal, an organic salt of an alkali metal, a chlorine-based oxidizer, and a phosphate of an alkali metal, wherein the sum of the concentrations of the alkali metal carbonate and the alkali metal organic salt is between 0.01 mol/L and 0.02 mol/L, inclusive.

Polishing GaInAsP compound semiconductor faces utilizing a polishing agent of the present invention reduces surface haze (surface micro-roughness), LPDs (light point defects) and the like. And since the chemical action of a polishing agent of the present invention does not grow overly weak, scratching and micro-roughness may be minimized. Hence, polishing GaInAsP compound semiconductor faces utilizing a polishing agent of the present invention allows surface quality to be favorably maintained. Furthermore, polishing GaInAsP compound semiconductor faces utilizing a polishing agent of the present invention makes it possible to keep the polishing rate from dropping. Consequently, by means of a polishing agent of the present invention, favorable quality in compound semiconductor faces can be maintained, and high polishing rates can be maintained as well.

In the foregoing polishing agent, the alkali metal carbonate preferably is sodium carbonate. In that case, the concentration of the sodium carbonate within the polishing agent preferably is between 0.008 mol/L and 0.018 mol/L, inclusive.

With the sodium carbonate concentration being not less than 0.008 mol/L, increase in haze may be further controlled to a minimum, and with the sodium carbonate concentration being not greater than 0.018 mol/L, increase in LPDs may be further controlled to a minimum.

In the foregoing polishing agent, the alkali metal organic salt preferably is a sodium dicarboxylate. This leads to advantages in terms of polishing characteristics, stability, and cost.

In the foregoing polishing agent, preferably the sodium dicarboxylate is at least one substance selected from the group consisting of sodium tartrate, sodium malate, and sodium succinate. This leads to further advantages in terms of polishing characteristics, stability, and cost.

In the foregoing polishing agent, the chlorine-based oxidizer preferably is sodium dichloroisocyanurate. In that case, the concentration of the sodium dichloroisocyanurate within the polishing agent preferably is between 0.035 mol/L and 0.060 mol/L, inclusive.

With the sodium dichloroisocyanurate concentration being not less than 0.035 mol/L, falloff in polishing rate may be kept further under control. With the sodium dichloroisocyanurate concentration being not greater than 0.060 mol/L, increase in haze may be kept further under control.

In the foregoing polishing agent, the alkali metal phosphate preferably is sodium tripolyphosphate. In that case, the concentration of the sodium tripolyphosphate within the polishing agent preferably is between 0.015 mol/L and 0.025 mol/L.

With the sodium tripolyphosphate concentration being not less than 0.015 mol/L, falloff in polishing rate may be kept further under control. The sodium tripolyphosphate concentration being not greater than 0.025 mol/L keeps surface oxide-film formation from increasing in thickness.

In the foregoing polishing agent, preferably the pH is between 8.5 and 9.5 inclusive, and the redox potential $y$ (mV) when the pH value is given as $x$ satisfies $-60x+1400 \leq y \leq -60x+1700$.

Making the pH be in the just-noted range, and having the redox potential be not less than $-60x+1400$ makes it possible to strengthen the oxidizing action on the face of the compound semiconductor, whereby falloff in polishing rate may be kept further under control. Making the pH be in the just-noted range, and having the redox potential be not more than $-60x+1700$ keeps oxidation of the compound semiconductor face from advancing too far. Increase in haze may be thereby kept further under control, and likewise LPDs may be further controlled to a minimum. What is more, corrosive action on the polishing pads and equipment may be held to a minimum, whereby polishing in a stabilized state is possible.

A compound semiconductor manufacturing method of the present invention is designed with a step of preparing a $Ga_\alpha In_{(1-\alpha)} As_\beta P_{(1-\beta)}$ ($0 \leq \alpha \leq 1$; $0 \leq \beta \leq 1$) compound semiconductor, and a step of polishing the face of the compound semiconductor utilizing a polishing agent set forth in any of the above descriptions.

In accordance with a compound semiconductor manufacturing method of the present invention, a polishing agent set forth in any of the above descriptions is utilized, thereby enabling favorable quality in the compound semiconductor face to be maintained, and a high polishing rate to be maintained as well.

In the polishing step of the foregoing compound semiconductor manufacturing method, preferably the polishing is done in a manner such that, letting the viscosity of the polishing agent be $\eta$ (mPa·s), the peripheral speed be V (m/s), and the applied pressure be P (kPa), the load coefficient L expressed as $\eta \times V/P$ is between $0.08 \times 10^9$ and $0.30 \times 10^{-9}$, inclusive.

With the load coefficient L being not less than $0.08 \times 10^{-9}$, the load on the compound semiconductor during the polishing step may be kept from growing forceful. Scratching and microroughness in the semiconductor face can thereby be kept from increasing, and at the same time, increase in LPDs may thereby be kept under control. The load coefficient L being not greater than $0.30 \times 10^{-9}$ allows falloff in polishing rate to be minimized, and keeps increase in haze under control as well.

The foregoing compound semiconductor manufacturing method preferably is provided with a step of washing the compound semiconductor face following the polishing step described above. This makes it possible to more favorably maintain the quality of the compound semiconductor face.

With the foregoing compound semiconductor manufacturing method it is preferable that in the preparation step GaAs (gallium arsenide) is prepared as the compound semiconductor, and that the polishing step and the washing step render the compound semiconductor such as to have a surface oxygen (O) concentration of between 4 atomic % and 12 atomic % inclusive, and a surface chlorine (Cl) concentration of between $120 \times 10^{10}$ atoms/cm$^2$ and $1500 \times 10^{10}$ atoms/cm$^2$ inclusive.

By polishing the GaAs in a manner such that the oxygen concentration is not less than 4 atomic % and the chlorine concentration is not less than $120 \times 10^{10}$ atoms/cm$^2$, a high resistance layer may be kept from forming at the interface when an epitaxial layer has been formed onto the GaAs. By polishing the GaAs in a manner such that the oxygen concentration is not greater than 12 atomic % and the chlorine concentration is not greater than $1500 \times 10^{10}$ atoms/cm$^2$, deterioration of the epitaxial layer's crystallinity, and roughness and similar falloff in its quality may be kept under control.

With the foregoing compound semiconductor manufacturing method, preferably the polishing step and the washing step render the compound semiconductor such as to have a surface sulfur (S) concentration of between $120 \times 10^{10}$ atoms/cm$^2$ and $1500 \times 10^{10}$ atoms/cm$^2$, inclusive.

This makes it possible, when epitaxial layers are formed onto the compound semiconductor, to form epitaxial layers in which favorable quality is maintained.

A semiconductor device manufacturing method of the present invention is designed with a step of preparing a compound semiconductor manufactured by a compound semiconductor manufacturing method of any of the foregoing descriptions, and a step of forming an at least singe-lamina epitaxial layer onto the prepared compound semiconductor.

With the compound semiconductor preparing step included in a compound semiconductor manufacturing method of the present invention, a polishing agent is utilized that enables the surface quality of the compound semiconductor to be favorably maintained, and that enables a high polishing rate to be maintained as well. Deterioration in the quality of epitaxial layers formed onto the face of a compound semiconductor obtained by the foregoing preparation step may therefore be kept under control, and what is more, the forming of a high-resistance layer at the interface between the epitaxial layer and the compound semiconductor can therefore be kept under control. Manufacturing semiconductor devices having favorable quality is consequently possible.

Advantageous Effects of Invention

By means of a polishing agent of the present invention, the surface quality of a compound semiconductor can be favorably maintained, and a high polishing rate can be maintained as well. Furthermore, in accordance with a compound semiconductor manufacturing method of the present invention, a polishing agent of the present invention is utilized, whereby compound semiconductor of favorable surface quality can be obtained. In accordance with a semiconductor device manufacturing method of the present invention, the forming of a high-resistance layer at the interface between the epitaxial layer and the compound semiconductor can be kept under control, whereby manufacturing semiconductor devices having favorable quality is enabled.

DESCRIPTION OF EMBODIMENTS

Below, a description of modes of embodying, and of embodiment examples of, the present invention will be made based on the drawings. It should be understood that in the following, identical or corresponding parts in the drawings are labeled with identical reference marks, and their description will not be repeated.

Embodying Mode 1

An explanation of a polishing agent that is Embodying Mode 1 of the present invention will be made. A polishing agent of the present Embodying Mode 1 is a polishing agent utilized on a $Ga_\alpha In_{(1-\alpha)}As_\beta P_{(1-\beta)}$ ($0 \leq \alpha \leq 1$; $0 \leq \beta \leq 1$) compound semiconductor, and includes a carbonate of an alkali metal, an organic salt of an alkali metal, a chlorine-based oxidizer, and a phosphate of an alkali metal.

The sum of the concentrations of the alkali metal carbonate and the alkali metal organic salt is between 0.01 mol/L and 0.02 mol/L, inclusive, and preferably is between 0.014 mol/L and 0.016 mol/L, inclusive.

The pH of the polishing agent can be adjusted by the amount of alkali metal carbonate added.

Also, by making the sum of the two concentrations be within the above-stated range, the etching action of the polishing agent can be controlled. Furthermore, by making the sum of the concentrations be within the above-stated range, the concentration of available chlorine in the polishing agent can be controlled.

In sum, by its containing both an alkali metal carbonate and an alkali metal organic salt, with the sum of their concentrations being put within the aforementioned range, both favorable surface quality (surface properties) and a high polishing rate can be managed. Haze augments with the sum of the concentrations of the alkali metal carbonate and the alkali metal organic salt being less than 0.01 mol/L, while LPDs augment with the sum exceeding 0.02 mol/L.

An alkali metal carbonate means a compound (salt) containing an alkali metal ion and a carbonate ion ($CO_3^{2-}$); sodium carbonate and potassium carbonate are examples that may be given. It should be understood that an "alkali metal" means a metal atomic element belonging to Group I of the traditional IUPAC (International Union of Pure and Applied Chemistry) naming system—namely, lithium (Li), sodium (Na), potassium (K), rubidium (Rb), cesium (Cs) and francium (Fr).

The concentration of the alkali metal carbonate preferably is between 0.008 mol/L and 0.018 mol/L. The concentration being not less than 0.008 mol/L allows haze augmentation to be controlled to a minimum. The concentration being not greater than 0.018 mol/L allows LPD augmentation to be controlled to a minimum.

An alkali metal organic salt means a compound (salt) containing an alkali metal ion and an ion of an organic acid; sodium organic salts and potassium organic salts are examples that may be given. For the sodium organic salt, a sodium dicarboxylate is preferable from the perspectives of polishing properties, stability and cost. And further, supplementarily adding a metal to have a chelating action is effective for keeping contamination under control and enhancing the polishing rate. From the same perspectives, the sodium dicarboxylate preferably is at least one substance selected from the group consisting of sodium tartrate, sodium malate, and sodium succinate.

The concentration of the alkali metal organic salt preferably is between 0.002 mol/L and 0.004 mol/L, inclusive. Adding an alkali metal organic salt at a concentration of not less than 0.002 mol/L makes it possible to further bring out the effect of controlling the etching action of the polishing agent. The alkali metal organic salt being at a concentration of not greater than 0.004 mol/L makes it possible to keep the concentration of available chlorine within the polishing agent from falling off. What is more, wastewater carbon concentration may be kept from growing high, and biochemical oxygen demand (BOD) and chemical oxygen demand (COD) may be kept from growing high, to keep problems in terms of environmental preservation from occurring.

A chlorine-based oxidizer means a compound, such as a hypochlorite, incorporating the chlorate ion ($ClO^-$). Alternatively, a chlorine-based oxidizer means a compound, such as chlorinated isocyanuric acid salt, incorporating a solid substance that by being dissolved in water gives off chlorate ions ($ClO^-$). The chlorine-based oxidizer may be, to give examples, sodium dichloroisocyanurate, potassium dichloroisocyanurate, or trichloroisocyanurate. Among these, sodium dichloroisocyanurate is preferable. The chlorine-based oxidizer promotes oxidation of the compound semiconductor face.

The concentration of the chlorine-based oxidizer preferably is between 0.035 mol/L and 0.060 mol/L, inclusive, and more preferably is between 0.040 mol/L and 0.050 mol/L, inclusive. By making the concentration of the chlorine-based oxidizer be not less than 0.035 mol/L, the polishing rate may be kept from dropping, and still more, by making it be not less than 0.040 mol/L, the polishing rate may be further kept from falling off. On the other hand, by making the concentration of the chlorine-based oxidizer be not greater than 0.060 mol/L, increase in haze may be kept under control, and still more, by making it be not greater than 0.050 mol/L, increase in haze may be further kept under control.

An alkali metal phosphate means a compound (salt) containing an alkali metal ion and a phosphate ion, and may be, to give examples, an orthophosphate, a pyrophosphate, a tripolyphosphate, a tetraphosphate, or a hexametaphosphate. Among these, sodium tripolyphosphate is preferable. The alkali metal phosphate acts to dissolve oxidation films forming on the face of the compound semiconductors. And further, supplementarily adding a metal to have a chelating action is effective for keeping contamination under control and enhancing the polishing rate.

The concentration of the alkali metal phosphate preferably is between 0.015 mol/L and 0.025 mol/L, inclusive, and more preferably is between 0.018 mol/L and 0.022 mol/L, inclusive. With the concentration of the alkali metal phosphate being not less than 0.015 mol/L, the thickness of the oxidation layer that forms on the face may be kept from increasing, and with it being not less than 0.018 mol/L, the oxidation layer thickness may be further kept from increasing. On the other hand, with the concentration of the alkali metal phosphate being not greater than 0.025 mol/L, the polishing rate may be kept from dropping, and with it being not greater than 0.022 mol/L, the polishing rate may be kept further from falling off.

The pH of the polishing agent preferably is between 8.5 and 9.5, inclusive. In that case the face of the compound semiconductor may oxidize effectively, whereby a high polishing rate may be sustained.

It is preferable that the redox potential y (mV) of the polishing agent when the pH value is given as x satisfy $-60x+1400 \leq y \leq -60x+1700$. By having the redox potential y of the polishing agent be not less than $-60x+1400$, the oxidizing action on the compound semiconductor face may be kept from growing weak, whereby the polishing rate may be kept from falling off. Furthermore, the mechanical action may be kept from growing forceful, whereby scratching and microroughness may be kept from increasing. By having the redox potential y of the polishing agent be not greater than $-60x+1700$, oxidation of the compound semiconductor face may be kept from progressing too far, whereby increase in haze may be kept to a minimum. Furthermore, corrosive action on the polishing pads and equipment may be kept from growing strong, whereby polishing in a stabilized state is possible. Here, scratching can be evaluated by optical microscopic observation, or by visual observation under illumination by a fluorescent lamp or spot beam. Microroughness can be evaluated by AFM or with an optical interferometric profilometer.

A polishing agent in the present Embodying Mode 1 is utilized on a $Ga_\alpha In_{(1-\alpha)} As_\beta P_{(1-\beta)}$ ($0 \leq \alpha \leq 1$; $0 \leq \beta \leq 1$) compound semiconductor. That is, a polishing agent in the present Embodying Mode 1 is utilized on GaAs, on InP (indium phosphide), and on crystal alloys thereof. A polishing agent in the present Embodying Mode 1 preferably is utilized on crystal of not less than 50% Ga or As, and more preferably is utilized on GaAs.

When a $Ga_\alpha In_{(1-\alpha)} As_\beta P_{(1-\beta)}$ ($0 \leq \alpha \leq 1$; $0 \leq \beta \leq 1$) compound semiconductor is employed as a substrate for epitaxial growth, the quality of the substrate face becomes crucial. Surface quality differs from quality of the crystal bulk. The chemical durability of GaInAsP is high compared with Si, while with polishing agents for Si, surface oxidation does not proceed readily. Consequently, with polishing agents for Si, during a GaInAsP polish the mechanical action predominates, such that scratching and microroughness on the substrate face increase. Furthermore, the polishing rate falls off, giving rise to problems with productivity.

Against that backdrop, in order to increase the chemical action of the polishing agent employed on $Ga_\alpha In_{(1-\alpha)} As_\beta P_{(1-\beta)}$ ($0 \leq \alpha \leq 1$; $0 \leq \beta \leq 1$), technology whereby an oxidizer is added to increase the redox potential is conceivable. Yet because the chemical durability of $Ga_\alpha In_{(1-\alpha)} As_\beta P_{(1-\beta)}$ ($0 \leq \alpha \leq 1$; $0 \leq \beta \leq 1$) is low compared with GaN (gallium nitride) and AN (aluminum nitride), it is susceptible to being altered by the chemical action of the polishing agent and by the atmosphere, such that surface control is extraordinarily difficult. Moreover, the action of the chemical components of the polishing agent differ depending on the nature of the substrate material, and what is an appropriate pH and potential, or pH adjusting agent and oxidizer, will differ depending on the nature of each crystal material.

From perspectives such as these, the polishing agents set forth in earlier-cited Patent References 1 through 4 have been inadequate to manage both surface properties and polishing rate.

The present inventors discovered that in a polishing agent, in addition to exploiting the oxidation properties that a chlorine-based oxidizer has with respect to the face of a compound semiconductor, and the oxidation-film removal properties that an alkali metal phosphate has, by containing an alkali metal carbonate and an alkali metal organic salt the sum of whose concentrations is between 0.01 mol/L and 0.02 mol/L, inclusive, the pH adjustment and the etching action of the polishing agent could be controlled. As a result, the present inventors clarified for the first time that by means of a polishing agent of the present Embodying Mode 1, the polishing rate and the quality of the GaInAsP face that is polished could be controlled. Accordingly, by utilizing a polishing agent of the present Embodying Mode 1 to polish GaInAsP, the quality of the GaInAsP face can be favorably maintained, and a high polishing rate can be sustained as well.

It should be understood that as long as the sum of the concentrations of alkali metal carbonate and alkali metal organic salt in the polishing agent during polishing is between 0.01 mol/L and 0.02 mol/L, inclusive, even if a portion of the alkali metal organic salt is replaced with an organic acid and sodium hydroxide, or a portion of the alkali metal carbonate is replaced with a carbonic acid and sodium hydroxide, the same resultant benefits just discussed will be obtained. Nevertheless, given their chemical stability and ease of handling, additive inclusion by an alkali metal organic salt and an alkali metal carbonate is preferable.

Embodying Mode 2

Figure 1:
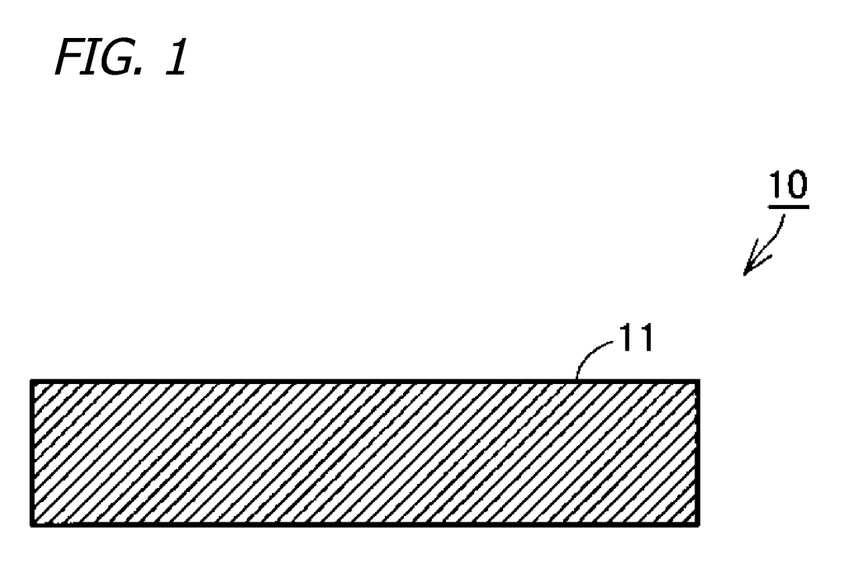
FIG. 1 is a cross-sectional diagram representing, in simplified form, a compound semiconductor of a second embodying mode of the present invention.

Embodying Mode 2 of the present invention relates to a compound semiconductor. FIG. 1 is a cross-sectional diagram representing, in simplified form, a compound semiconductor 10 of Embodying Mode 2. Referring to FIG. 1, an explanation of the compound semiconductor 10 of the present Embodying Mode 2 will be made.

As represented in FIG. 1, the compound semiconductor 10 is substrate having a face 11. The compound semiconductor 10 is a $Ga_\alpha In_{(1-\alpha)} As_\beta P_{(1-\beta)}$ ($0 \leq \alpha \leq 1$; $0 \leq \beta \leq 1$) compound semiconductor, preferably is a crystal of not less than 50% Ga or As, and more preferably is GaAs.

The method of growing the foregoing compound semiconductor crystal is not particularly limited; it may be grown by such methods as the HB (horizontal Bridgman) technique, the LEC (liquid-encapsulated Czochralski) technique, and the VB (vertical Bridgman) technique.

The face 11 preferably has an oxygen concentration of between 4 atomic % and 12 atomic %, inclusive, and more preferably has an oxygen concentration of between 5 atomic % and 10 atomic %, inclusive. With the oxygen concentration being not less than 4 atomic %, the forming of a high resistance layer at the interface during growth of an epitaxial layer formed onto the compound semiconductor 10 may be kept under control. With it being not less than 5 atomic %, the forming of a high resistance layer may be further kept to a minimum. With the oxygen concentration being not greater than 12 atomic %, deterioration of epitaxial layer crystallinity, and roughness and similar falloff in its quality may be kept under control. With it being not greater than 10 atomic %, deterioration in the quality of the epitaxial layer may be further kept to a minimum.

It should be understood that the foregoing oxygen concentrations are values determined by Auger electron spectroscopy (AES) or x-ray photoelectron spectroscopy (XPS), for example. AES characterizes the chemical composition from the Auger election escape depth to a 5-nm level from the episurface along the face 11. AES exemplarily has a resolving power on the order of 0.1%.

The face 11 preferably has a chlorine concentration of between $120\times10^{10}$ atoms/cm$^2$ and $1500\times10^{10}$ atoms/cm$^2$, inclusive, and more preferably has a chlorine concentration of between $200\times10^{10}$ atoms/cm$^2$ and $1000\times10^{10}$ atoms/cm$^2$, inclusive. With the chlorine concentration being not less than $120\times10^{10}$ atoms/cm$^2$, the forming of a high resistance layer at the interface during growth of an epitaxial layer formed onto the compound semiconductor 10 may be kept under control. With it being not less than $200\times10^{10}$ atoms/cm$^2$, the forming of a high resistance layer may be further kept to a minimum. With the chlorine concentration being not greater than $1500\times10^{10}$ atoms/cm$^2$, deterioration of epitaxial layer crystallinity, and roughness and similar falloff in its quality may be kept under control. With it being not greater than $1000\times10^{10}$ atoms/cm$^2$, deterioration in the quality of the epitaxial layer may be further kept to a minimum.

The face 11 preferably has a sulfur concentration of between $120\times10^{10}$ atoms/cm$^2$ and $1500\times10^{10}$ atoms/cm$^2$, inclusive, and more preferably has a sulfur concentration of between $150\times10^{10}$ atoms/cm$^2$ and $1000\times10^{10}$ atoms/cm$^2$, inclusive. With the sulfur concentration being not less than $120\times10^{10}$ atoms/cm$^2$, the forming of a high resistance layer at the interface during growth of an epitaxial layer formed onto the compound semiconductor 10 may be kept under control. With it being not less than $150\times10^{10}$ atoms/cm$^2$, the forming of a high resistance layer may be further kept to a minimum. With the sulfur concentration being not greater than $1500\times10^{10}$ atoms/cm$^2$, deterioration of epitaxial layer crystallinity, and roughness and similar falloff in its quality may be kept under control. With it being not greater than $1000\times10^{10}$ atoms/cm$^2$, deterioration in the quality of the epitaxial layer may be further kept to a minimum.

It should be understood that the foregoing chlorine concentrations and sulfur concentrations are values determined by TXRF, for example.

TXRF characterizes the chemical composition from the x-ray probe depth to, for example, a 5-nm level from the episurface along the face 11. Here, "face 11" has a thickness obtained measuring its constituent components by means of TXRF or AES, and has a thickness on the order of 5 nm, for example.

In addition, the difference between the surface and internal chemical composition of the compound semiconductor 10, and the chemical composition of the interface between the compound semiconductor 10 and the epitaxial layer that is formed onto it can be characterized for example by carrying out a depthwise analysis by means of SIMS.

Haze in the face 11 preferably is not greater than 1.6 ppm, and more preferably is not greater than 1.0 ppm.

Likewise, LPDs in the face 11 are preferably fewer than 14 defects/substrate, and more preferably are 10 or less defects/substrate.

Herein, the aforementioned haze and LPDs are values determined by, for example, surface scanning Also, an oxidation layer (not illustrated) may be formed on the face 11. In that case, the thickness of the oxidation layer preferably is not greater than 1 nm, and more preferably is not greater than 0.8 nm. Such an implementation may keep the quality of the epitaxial layer that is formed onto the compound semiconductor 10 from degrading. It should be noted that the thickness of just-described oxidation layer is a value determined with an ellipsometer.

Embodying Mode 3

Embodying Mode 3 of the present invention relates to a manufacturing method, and by means of the manufacturing method, a compound semiconductor 10 of Embodying Mode 2 is created. The manufacturing procedure of Embodying Mode 3 is set forth in the FIG. 2 flowchart. Below, referring to FIGS. 1 and 2, an explanation of a manufacturing method of present Embodying Mode 3 will be made.

Figure 2:
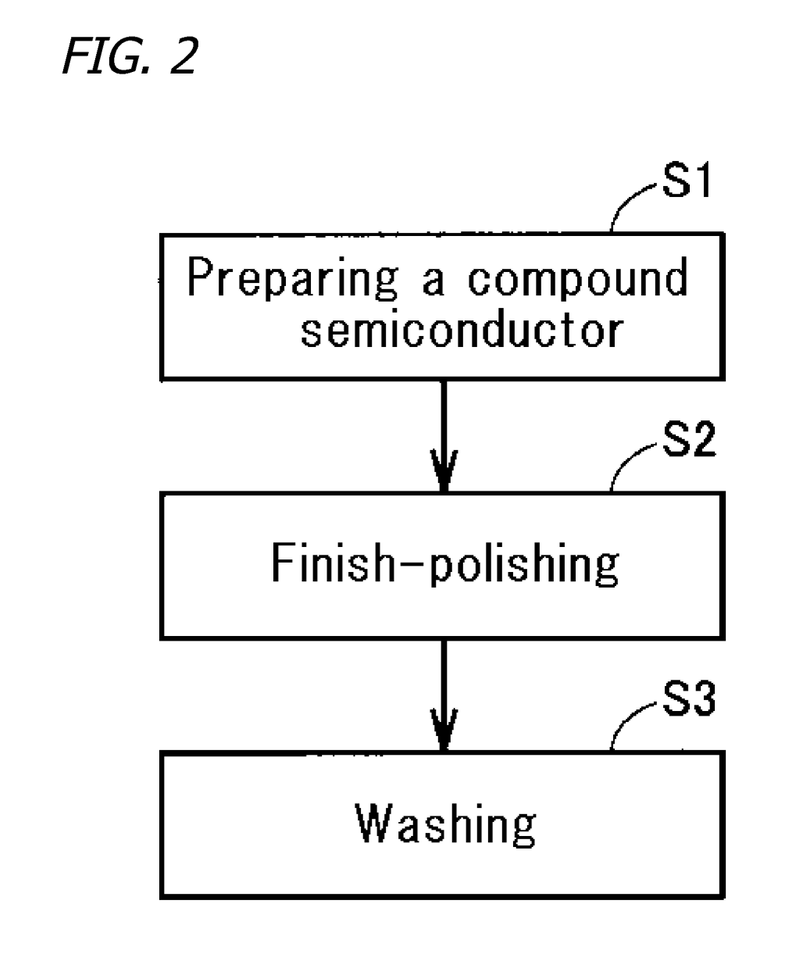
FIG. 2 is a flowchart setting forth a manufacturing procedure in a third embodying mode of the present invention.

Reference is made to FIG. 2. In a manufacturing method of Embodying Mode 3, to begin with, a $Ga_\alpha In_{(1-\alpha)}As_\beta P_{(1-\beta)}$ ($0\leq\alpha\leq1$; $0\leq\beta\leq1$) compound semiconductors are prepared (Step S1). The compound semiconductors prepared in Step S1 preferably are crystals of not less than 50% Ga or As, and more preferably are GaAs. In Step S1, substrates having a face are prepared as the compound semiconductors.

In Step S1, the following processes are for example carried out. To begin with, an ingot of a GaInAsP compound semiconductor is grown by the HB technique, VB technique, or a similar process. The ingot made by the crystal growth is subject to operations including machining the ingot along its circumferential periphery and slicing it, and grinding, lapping, polishing and washing the slices, to fabricate the compound semiconductors. In order to planarize the compound semiconductors, mechanical operations including grinding and lapping may be carried out. As surface-finishing processes, after polishing in order to reduce roughness and remove the laminae materially altered by the machining operations, CMP (chemical-mechanical polishing), chemical polishing, or a like process may be carried out.

It should be understood that the compound semiconductors prepared in Step S1 may be, for example, bulk crystal, or a thin film formed onto a base form constituted from a bulk crystal or the like.

Next, the polishing agent of Embodying Mode 1 is utilized to finishing-polish the face of the compound semiconductors (Step S2). In Step S2, from a surface-quality improvement perspective, the polishing agent preferably does not contain abrasive grains. Surface scratching, roughness, etc. is thereby ameliorated.

In Step S2, preferably the polishing is done in a manner such that, letting the viscosity of the polishing agent be $\eta$ (mPa·s), the peripheral speed be V (m/s), and the applied pressure be P (kPa), the load coefficient L expressed as $\eta\times V/P$ is between $0.08\times10^{-9}$ and $0.30\times10^{-9}$, inclusive. With the load coefficient L being not less than $0.08\times10^{9}$, the load on the compound semiconductors during polishing may be kept from growing forceful, whereby scratching, microroughness, etc. may be kept from increasing, and furthermore, increase in LPDs may be kept under control. With the load coefficient L being not greater than $0.30\times10^{9}$ the polishing rate may be kept from falling off, and increase in haze may be kept under control. Furthermore, the amount of Cl in the compound semiconductor faces may be kept to a minimum.

It should be understood that the viscosity discussed above may be adjusted by the concentrations of the chemical constituents, or by adding a high-viscosity organic compound such as ethylene glycol.

After adjustment of the polishing agent employed in Step S2, preferably the time until it is utilized to polish is within 60 minutes. By being within 60 minutes, decline in effectiveness of the polishing agent may be minimized, whereby scratching, microroughness, and the like may be kept from becoming worse. In light of this consideration, the time preferably is within 40 minutes, and more preferably is between 5 minutes and 30 minutes, inclusive.

Owing to the utilization of a polishing agent of Embodying Mode 1, the polishing rate in Step S2 can be, for example, 1.8 μm/minute or greater.

In Step S2, preferably the polishing is done in a manner such that the chlorine $1500 \times 10^{10}$ atoms/cm$^2$, inclusive, and more preferably the polishing is done in a manner such that it is between $200 \times 10^{10}$ atoms/cm$^2$ and $1000 \times 10^{10}$ atoms/cm$^2$, inclusive. The chlorine concentration in the compound semiconductor faces may be adjusted by means of the load coefficient L described earlier. Specifically, the chlorine concentration in the compound semiconductor faces can be raised by the load coefficient L being large, while the chlorine concentration in the faces can be reduced by the load coefficient L being small. Also, the chlorine concentration in the compound semiconductor faces can be adjusted via the concentration of chlorine ions in the polishing agent.

In Step S2, the polishing is done in a manner such that the oxygen concentration in the compound semiconductor faces preferably is between 4 atomic % and 12 atomic %, inclusive, and more preferably is between 5 atomic % and 10 atomic %, inclusive. The oxygen concentration in the compound semiconductor faces can be adjusted via the redox potential of the polishing agent. In order to realize an oxygen concentration in the foregoing range, a polishing agent for example having a pH of between 8.5 and 9.5, inclusive, and whose redox potential y (mV) when the pH value is given as x satisfies $-60x+1400 \leq y \leq -60x+1700$ is utilized. In order to improve device yields, it is preferable that the chlorine concentration in the faces be between $120 \times 10^{10}$ atoms/cm$^2$ and $1500 \times 10^{10}$ atoms/cm$^2$, inclusive, and the oxygen concentration be between 4 atomic % and 12 atomic %, inclusive. For that purpose, it is preferable that a polishing agent whose redox potential y (mV) when the pH value is given as x satisfies $-60x+1400 \leq y \leq -60x+1700$ be utilized to polish under conditions in which the load coefficient L is between $0.08 \times 10^{-9}$ and $0.30 \times 10^9$, inclusive.

In addition, in Step S2 preferably the polishing is done in a manner such that the sulfur concentration in the faces is between $120 \times 10^{10}$ atoms/cm$^2$ and $1500 \times 10^{10}$ atoms/cm$^2$, inclusive.

Next, the compound semiconductor faces are washed (Step S3). During the washing in Step S3, bubbling or ultrasonic waves may be applied. Examples that may be given for this manner of washing include washing in IPA (isopropyl alcohol), washing in choline, and washing in purified water. In these cases, soiling may be efficiently removed and particles reduced. Also, a trace amount of sulfuric acid may be added to the purified water. In that case the S concentration in the faces can be kept to a minimum. The S concentration in the faces of the post-washed compound semiconductors preferably is between $120 \times 10^{10}$ atoms/cm$^2$ and $1500 \times 10^{10}$ atoms/cm$^2$, inclusive, and more preferably is between $150 \times 10^{10}$ atoms/cm$^2$ and $1000 \times 10^{10}$ atoms/cm$^2$, inclusive.

Furthermore, the thickness of the oxidation layer on the compound semiconductor faces can be reduced by means of the Step S3 wash. The post-washing thickness of the oxidation layer preferably is not greater than 1 nm, and more preferably is not greater than 0.8 nm.

If the chlorine concentration in the faces of the post-polished compound semiconductors yielded in Step S2 is less than $120 \times 10^{10}$ atoms/cm$^2$ or exceeds $1500 \times 10^{10}$ atoms/cm$^2$, then in Step S3, the wash preferably is carried out in a manner such that the chlorine concentration in the faces will be between $120 \times 10^{10}$ atoms/cm$^2$ and $1500 \times 10^{10}$ atoms/cm$^2$, inclusive.

Likewise, if the oxygen concentration in the faces of the post-polished compound semiconductors yielded in Step S2 is less than 4 atomic % or exceeds 12 atomic %, then in Step S3, the wash preferably is carried out in a manner such that the oxygen concentration in the faces will be between 4 atomic % and 12 atomic %, inclusive.

Examples that may be given for the above-described manner of washing include washing in hydrochloric acid, washing in choline, and washing in purified water.

If the sulfur concentration in the faces of the post-polished compound semiconductors in Step S2 is less than $120 \times 10^{10}$ atoms/cm$^2$ or exceeds $1500 \times 10^{10}$ atoms/cm$^2$, then in Step S3, the wash preferably is carried out in a manner such that the sulfur concentration in the faces will be between $120 \times 10^{10}$ atoms/cm$^2$ and $1500 \times 10^{10}$ atoms/cm$^2$, inclusive.

A compound semiconductor 10, represented in FIG. 1, of Embodying Mode 2 can be manufactured by implementing the aforedescribed steps (Steps S1 through S3).

In accordance with a manufacturing method of Embodying Mode 3, inasmuch as a polishing agent of Embodying Mode 1 is utilized, the concentration of impurities in the face 11 of the compound semiconductors 10 can be controlled into a proper range. Consequently, in employing a compound semiconductor 10 as a substrate for LEDs, lasers, or like semiconductor devices, forming of a high-resistance layer at the interface between the substrate and the epitaxial layer(s) can be restrained to a minimum. Accordingly, utilizing the compound semiconductors to manufacture semiconductor devices may keep the resistance from growing high, whereby falloff in light-emitting efficiency may be minimized.

Embodying Mode 4

Figure 3:
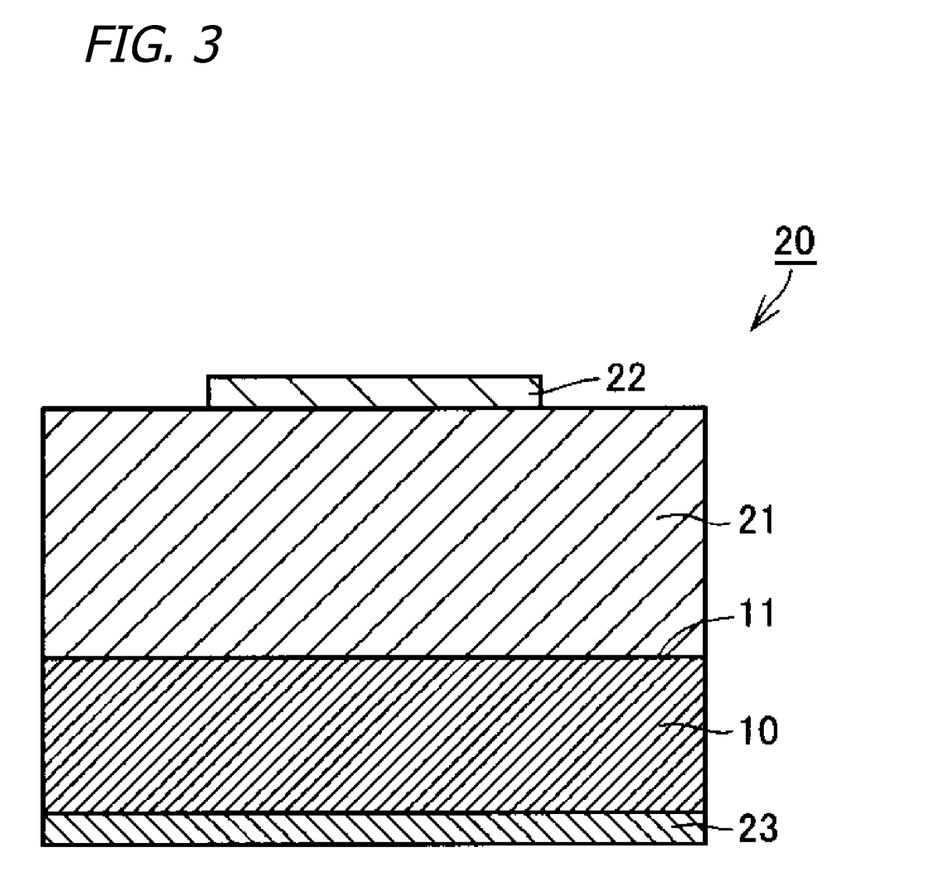
FIG. 3 is a cross-sectional diagram representing, in simplified form, a semiconductor device of a fourth embodying mode of the present invention.

FIG. 3 is a cross-sectional diagram representing, in simplified form, a semiconductor device 20 in Embodying Mode 4 of the present invention. Referring to FIG. 3, an explanation of the semiconductor device 20 of the present Embodying Mode 4 will be made.

Reference is made to FIG. 3. A semiconductor device 20 of Embodying Mode 4 is furnished with a compound semiconductor 10 of Embodying Mode 2, an epitaxial layer 21 formed onto the face 11 of the compound semiconductor 10, an electrode 22 formed onto the epitaxial layer 21, and an electrode 23 formed onto the compound semiconductor 10 on its side reverse from the epitaxial layer 21. The semiconductor device may be, to cite examples, a light-emitting device such as a light-emitting diode or laser diode, a microelectronic device such as a rectifier, bipolar transistor, field-effect transistor, or HEMT (high electron mobility transistor), a semiconductor sensor such as a temperature sensor, pressure sensor, radiation sensor, or visible-blind ultraviolet detector, or a SAW device (surface-acoustic wave device). In the present Embodying Mode 4, it is preferable that the epitaxial layer 21 include an active layer and the semiconductor device be a laser or LED.

Embodying Mode 5

Embodying Mode 5 of the present invention relates to a manufacturing method, and by means of the manufacturing method, a semiconductor device 20 of Embodying Mode 4 of the present invention is created.

Figure 4:
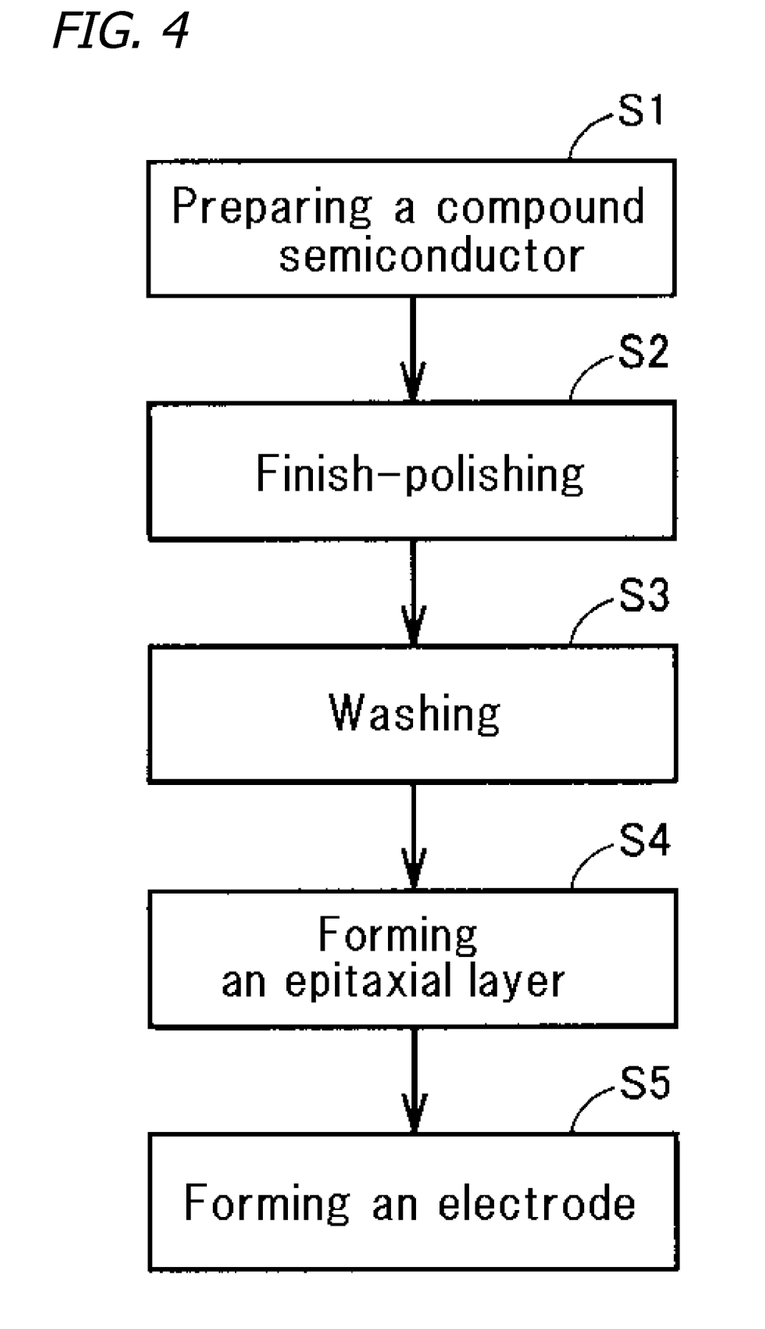
FIG. 4 is a flowchart setting forth a manufacturing procedure in a fifth embodying mode of the present invention.

FIG. 4 is a flowchart setting forth a procedure for manufacturing a semiconductor device 20. Below, an explanation of a manufacturing method in Embodying Mode 5 of the present invention will be made.

Reference is made to FIG. 4. Step S1 of preparing a compound semiconductor 10 in Embodying Mode 2, finish-polishing Step S2, and washing Step S3 are implemented.

Next, an epitaxial layer 21 is formed onto the face 11 of the compound semiconductor 10 (Step S4). Examples of techniques whereby the epitaxial layer 21 is formed include MOCVD (metalorganic chemical vapor deposition), MBE (molecular-beam epitaxy), or another vapor-phase technique, and LPE (liquid-phase epitaxy) or another liquid-phase technique.

Next, an electrode 22 is formed onto the epitaxial layer 21, and an electrode 23 is formed onto the compound semiconductor 10 on its side reverse from the epitaxial layer 21 (Step S5). The electrodes may be formed in tandem on the one, epitaxial layer 21 side. The electrodes 22 and 23 are formed, for example, by evaporation deposition. In addition, dicing into chips and mounting into packages can be carried out.

Implementing the above-described steps (Step S1 through S5) makes it possible to create a semiconductor device 20, represented in FIG. 3. In a semiconductor device manufactured in this way, because the surface properties of the face 11 of the compound semiconductor 10 are favorably maintained, impurities at the interface between the compound semiconductor 10 and the epitaxial layer 21 are controlled. Consequently, in an implementation, for example, in which the semiconductor device 20 is a light-emitting device, with the factors impeding the inflow of electrons into the active layer being reduced, the properties of the light-emitting device may be favorably maintained. What is more, by means of Embodying Mode 5, semiconductor devices 20 can be manufactured improving the yields.

Embodiment 1

In the present embodiment, the efficacy of a polishing agent containing a carbonate of an alkali metal, an organic salt of an alkali metal, a chlorine-based oxidizer, and a phosphate of an alkali metal, and in which the sum of the concentrations of the alkali metal carbonate and the alkali metal organic salt was between 0.01 mol/L and 0.02 mol/L, inclusive, was investigated.

Present Invention Examples 1-6 and Comparative Examples 1-9

To begin with, an Si-doped GaAs substrate grown by the VB technique was prepared as a compound semiconductor.

Thereafter its circumferential periphery was machined, it was sliced, and both sides of the slices were lapped and wet-etched, whereby non-specular substrates of 76 mm diameter and 550 μm thickness were respectively produced. The respective substrates were pasted to a ceramic plate, and unilateral polishing was implemented as a primary polish. For the unilateral polishing, CMP by means of a polishing agent containing colloidal silica was implemented (Step S1). The GaAs substrates were rendered specular by the primary polish.

Next, polishing agents of the compositions set forth in Table I and Table II were respectively prepared as polishing agents of Present Invention Examples 1 through 6 and Comparative Examples 1 through 9. The respective polishing agents were used to carry out respective polishes on the prepared GaAs substrates. For the polisher, a machine having a φ 820 mm platen diameter was employed, and the polishing pads employed were the suede type (Step S2).

After the finishing polish, the GaAs substrates were stripped off the plate, and subjected to an IPA wash, choline wash, and purified water wash (Step S3). The thickness of each substrate was 500 μm. Manufactured Present Invention Example 1-6 and Comparative Example 1-9 compound semiconductors were thereby obtained.

Evaluation Method

The polishing rates on the compound semiconductors of Present Invention Examples 1-6 and Comparative Examples 1-9 were respectively determined. The results are entered as the polishing rates ("Polishing speed (μm/min)") in Table I and Table II presented below.

A Surfscan® 6220 from KLA-Tencor Corporation was employed to determine the LPDs and haze in the faces of the Present Invention Example 1-6 and Comparative Example 1-9 compound semiconductors on which polishing had been carried out. The results are respectively entered in Table I and Table II presented below.

Onto the polished face of the compound semiconductors of Present Invention Examples 1-6 and Comparative Examples 1-9, an epitaxial layer was formed by MOCVD, and according to a PL-intensity determination method with the following conditions the PL intensity was determined. A light-emitting layer having a multiquantum well structure, formed by an n-type $Al_{x1}/Ga_{y1}In_{1-x1-y1}/P$ ($0<x_1$; $0<y_1$; $x_1+y_1<1$) semiconductor layer and five pairs of well layers ($Ga_{y3}In_{1-y3}P$ ($0<y_3<1$) layers) and barrier layers ($Al_{x4}Ga_{y4}In_{1-x4-y4}P$ ($0<x_4$; $0<y_4$; $x_4+y_4<1$) layers), a p-type $Al_{x2}Ga_{y2}In_{1-x2-y2}P$ ($0<x_2$; $0<y_2$; $x_2+y_2<1$) semiconductor layer, and a p-type GaAs contact layer was created as the epitaxial layer. With the excitation-beam wavelength being 532 nm, light of between 600 nm and 700 nm, inclusive, was dispersed and detected with a photomultiplier to compute the PL intensity. For the metrological device, a PLM 150, Nanometrics Inc. mfr., was employed. The results are entered as "PL intensity" (units: a.u.) at "Epi-properties" in Table I and Table II presented below (Step S4).

Following that, an Au—Zn contact electrode was formed as a p-side electrode onto the Present Invention Example 1-6 and Comparative Example 1-9 p-type GaAs contact layers by vacuum evaporation deposition. Onto the major surface—being where the Group III-V compound semiconductor layer was not formed—of the n-type GaAs semiconductor substrates, an Au—Ge contact electrode was formed as a n-side electrode by vacuum evaporation deposition (Step S5). The yields of semiconductor devices in this way fabricated were determined. The results are entered as "Yield" for "Device characteristics" in Table I and Table II presented below.

TABLE I

|  |  | Pres. Invent. Ex. 1 | Pres. Invent. Ex. 2 | Pres. Invent. Ex. 3 | Pres. Invent. Ex. 4 | Pres. Invent. Ex. 5 | Pres. Invent. Ex. 6 |
|---|---|---|---|---|---|---|---|
| Polishing agent molarity | Na carbonate (mol/L) | 0.008 | 0.008 | 0.012 | 0.014 | 0.014 | 0.018 |
|  | Na malate (mol/L) | 0.002 | 0.004 | 0.002 | 0.002 | 0.004 | 0.002 |
|  | Na dichloroisocyanurate (mol/L) | 0.03 | 0.03 | 0.03 | 0.03 | 0.03 | 0.03 |
|  | Na tripolyphoshate (mol/L) | 0.02 | 0.02 | 0.02 | 0.02 | 0.02 | 0.02 |
| Polishing characteristics | Polishing speed (μm/min) | 1.8 | 1.9 | 2 | 2 | 2 | 2.2 |
| Substrate | LPDs (defects/substrate) | 4 | 5 | 6 | 7 | 8 | 10 |

TABLE I-continued

| | | Pres. Invent. Ex. 1 | Pres. Invent. Ex. 2 | Pres. Invent. Ex. 3 | Pres. Invent. Ex. 4 | Pres. Invent. Ex. 5 | Pres. Invent. Ex. 6 |
|---|---|---|---|---|---|---|---|
| properties | HAZE (ppm) | 1.2 | 1 | 0.91 | 0.86 | 0.85 | 0.92 |
| Epi-properties | PL intensity (a.u.) | 1.2 | 1.6 | 1.8 | 1.7 | 1.5 | 1.4 |
| Device characteristics | Yield (%) | 56 | 62 | 75 | 70 | 58 | 53 |

TABLE II

| | | Comp. Ex. 1 | Comp. Ex. 2 | Comp. Ex. 3 | Comp. Ex. 4 | Comp. Ex. 5 | Comp. Ex. 6 | Comp. Ex. 7 | Comp. Ex. 8 | Comp. Ex. 9 |
|---|---|---|---|---|---|---|---|---|---|---|
| Polishing agent molarity | Na carbonate (mol/L) | 0.008 | 0.006 | 0.024 | 0.020 | 0.020 | 0 | 0 | 0.008 | 0.008 |
| | Na malate (mol/L) | 0 | 0.002 | 0 | 0.004 | 0 | 0.01 | 0.02 | 0.004 | 0.004 |
| | Na dichloroisocyanurate (mol/L) | 0.03 | 0.03 | 0.03 | 0.03 | 0.03 | 0.03 | 0.03 | 0 | 0.03 |
| | Na tripolyphoshate (mol/L) | 0.02 | 0.02 | 0.02 | 0.02 | 0.02 | 0.02 | 0.02 | 0.02 | 0 |
| Polishing characteristics | Polishing speed (μm/min) | 1.4 | 1.3 | 2.3 | 2.3 | 2.2 | 0.9 | 0.8 | 0.4 | 0.3 |
| Substrate properties | LPDs (defects/substrate) | 7 | 5 | 41 | 32 | 14 | 12 | 13 | 22 | 24 |
| | HAZE (ppm) | 2.1 | 2.3 | 1.2 | 1 | 1 | 2.8 | 2.8 | 1.4 | 1.5 |
| Epi-properties | PL intensity (a.u.) | 0.6 | 0.4 | 0.8 | 0.9 | 1.0 | 0.2 | 0.2 | 0.5 | 0.4 |
| Device characteristics | Yield (%) | 10 | 0 | 24 | 28 | 45 | 0 | 0 | 0 | 0 |

Evaluation Results

On the face of the compound semiconductors of Present Invention Examples 1-6, where, as set forth in Table I, the sum of the concentrations of the alkali metal carbonate and the alkali metal organic salt was between 0.01 mol/L and 0.02 mol/L, inclusive, the LPDs were 10 (defects/substrate) or fewer, while the haze was 1.2 ppm or less, such that favorable quality in the faces could be maintained. What is more, the polishing rates for Present Invention Examples 1-6 was 1.8 μm/minute or greater, meaning that a high polishing rate could be sustained.

Forming an epitaxial layer onto the face of compound semiconductors manufactured utilizing the polishing agents of Present Invention Examples 1-6 enabled the PL intensity to be made 1.2 a.u. or greater, and allowed high quality in the epitaxial layer to be maintained.

Fabricating semiconductor devices using compound semiconductors manufactured utilizing the polishing agents of Present Invention Examples 1-6 enabled the yield to be 53% or greater.

On the other hand, as set forth in Table II, with Comparative Example 1, in which a polishing agent with little alkali metal carbonate and not containing an alkali metal organic salt was employed, and with Comparative Example 2, in which a polishing agent with whose alkali-metal carbonate and organic salt sum was small, haze was high and the polishing rate was low.

With Comparative Example 3, in which a polishing agent with much alkali metal carbonate and not containing an alkali metal organic salt was employed, and with Comparative Example 4, whose alkali-metal carbonate and organic salt sum was large, the LPDs were high.

With Comparative Example 5, in which a polishing agent not containing an organic salt was employed, the LPDs were high. With Comparative Examples 6 and 7, in which a polishing agent not containing an alkali metal carbonate was employed, the haze and LPDs were high, and the polishing rate was low.

With Comparative Example 8, in which a polishing agent not containing a chlorine-based oxidizer was employed, the haze and LPDs were high, and the polishing rate was low.

With Comparative Example 9, in which a polishing agent not containing an alkali metal phosphate was employed, the haze and LPDs were high, and the polishing rate was low.

Furthermore, forming epitaxial layers using the compound semiconductors of Comparative Examples 1 through 9 led to PL intensities that were lower than those of Present Invention Examples 1 thorough 6. Likewise, the yields when semiconductor devices were manufactured using the compound semiconductors of Comparative Examples 1 through 9 were lower than for Present Invention Examples 1 thorough 6. From these facts it was understood that deterioration in semiconductor device quality originates in the quality of the compound semiconductor faces being poor.

As given in the foregoing it could be confirmed that, in accordance with the present invention, by utilizing a polishing agent that includes a carbonate of an alkali metal, an organic salt of an alkali metal, a chlorine-based oxidizer, and a phosphate of an alkali metal, and wherein the sum of the concentrations of the alkali metal carbonate and the alkali metal organic salt is between 0.01 mol/L and 0.02 mol/L, inclusive, favorable quality in compound semiconductor faces can be maintained, and high polishing rates can be maintained as well.

Embodiment 2

In the present embodiment, the efficacy of utilizing sodium dichloroisocyanurate having a concentration of between 0.035 mol/L and 0.060 mol/L, inclusive, as the chlorine-based oxidizer was investigated.

Present Invention Examples 7-12

To begin with, the same process operations as in Embodiment 1 were performed to prepare Si-doped GaAs substrates, grown by the HB technique, as compound semiconductors (Step S1).

Next, polishing agents of the compositions set forth in Table III below were respectively prepared as polishing agents of Present Invention Examples 7 through 12. The finishing polish basically was performed in the same manner as in Present Invention Examples 1-6, but differed in that the finishing polish was made by means of the polishing agents set forth in Table III. Substrates of 50 mm diameter and 400 µm thickness were thereby respectively produced. This yielded the manufactured compound semiconductors of Present Invention Examples 7-12.

Evaluation Method

The polishing rates (polishing speeds) on, and LPDs and haze in the compound semiconductors of Present Invention Examples 7-12 were determined for each. The polishing rate, LPDs, and haze were determined in the same manner as in Embodiment 1. The results are entered in Table III presented below.

In addition, the PL intensity and semiconductor device yield utilizing the compound semiconductors of Present Invention Examples 7-12 were determined for each in the same way as in Embodiment 1. The results are indicated in Table III presented below.

0.035 mol/L and 0.060 mol/L, inclusive, as the chlorine-based oxidizer permitted the polishing rates to be further improved, and allowed the quality of the compound semiconductor faces to be more highly maintained.

Embodiment 3

In the present embodiment, the efficacy of the alkali metal phosphate being sodium tripolyphosphate having a concentration of between 0.015 mol/L and 0.025 mol/L, inclusive, was investigated.

Present Invention Examples 13-18

To begin with, Si-doped GaAs substrates grown by the VB technique were prepared as compound semiconductors (Step S1).

TABLE III

|  |  | Pres. Invent. Ex. 7 | Pres. Invent. Ex. 8 | Pres. Invent. Ex. 9 | Pres. Invent. Ex. 10 | Pres. Invent. Ex. 11 | Pres. Invent. Ex. 12 |
|---|---|---|---|---|---|---|---|
| Polishing agent molarity | Na carbonate (mol/L) | 0.008 | 0.008 | 0.008 | 0.008 | 0.008 | 0.008 |
|  | Na malate (mol/L) | 0.004 | 0.004 | 0.004 | 0.004 | 0.004 | 0.004 |
|  | Na dichloroisocyanurate (mol/L) | 0.030 | 0.035 | 0.040 | 0.050 | 0.060 | 0.090 |
|  | Na tripolyphoshate (mol/L) | 0.018 | 0.018 | 0.018 | 0.018 | 0.018 | 0.018 |
| Polishing characteristics | Polishing speed (µm/min) | 1.7 | 2 | 2.1 | 2.3 | 2.2 | 2.3 |
| Substrate properties | LPDs (defects/substrate) | 5 | 5 | 4 | 4 | 5 | 8 |
|  | HAZE (ppm) | 0.9 | 1 | 1.1 | 1.2 | 1.3 | 1.6 |
| Epi-properties | PL intensity (a.u.) | 1.2 | 1.2 | 1.2 | 1.2 | 1.1 | 1.2 |
| Device characteristics | Yield (%) | 64 | 68 | 70 | 72 | 71 | 63 |

Evaluation Results

As indicated in Table III, with the compound semiconductors of Present Invention Examples 7-12, it was apparent that low LPDs and haze could be maintained, and that a high polishing rate could be maintained. Likewise, it was understood that improvement in the properties of epitaxial layers, and the properties of devices, manufactured utilizing the compound semiconductors of Present Invention Examples 7-12 was permitted.

As indicated in Table III, it was apparent that with Present Invention Examples 8-11, in which sodium dichloroisocyanurate having a concentration of between 0.035 mol/L and 0.060 mol/L, inclusive, was utilized, in particular, low LPDs and haze could be maintained while high polishing rates could be sustained. That is, the polishing rate with Present Invention Example 7, in which less than 0.035 mol/L sodium dichloroisocyanurate was used, was lower than that with Present Invention Examples 8-11. Likewise, the haze in Present Invention Example 12, in which sodium dichloroisocyanurate in excess of 0.060 mol/L was used, was higher than that in Present Invention Examples 8-11.

As given in the foregoing, it could be confirmed that in accordance with the present invention, utilizing sodium dichloroisocyanurate having a concentration of between Next, polishing agents of the compositions set forth in Table IV below were respectively prepared as polishing agents of Present Invention Examples 13 through 18. The polishing basically was performed in the same manner as in Present Invention Examples 1-6, but differed in that the finishing polish was made by means of the polishing agents set forth in Table IV. Substrates of 76 mm diameter and 650 µm thickness were thereby respectively created. This yielded the manufactured compound semiconductors of Present Invention Examples 13-18.

Evaluation Method

In respect of the compound semiconductors of Present Invention Examples 13-18, the polishing rates (polishing speeds), the LPDs, the haze, and the thickness of the oxidation film on the finishing-polished faces were determined for each. The polishing rate, LPDs, and haze were determined in the same manner as in Embodiment 1. The oxidation film thicknesses were determined by means of an ellipsometer. The results are indicated in Table IV presented below.

In addition, the PL intensity and semiconductor device yield utilizing the compound semiconductors of Present Invention Examples 13-18 were determined for each in the same way as in Embodiment 1. The results are indicated in Table IV presented below.

TABLE IV

|  |  | Pres. Invent. Ex. 13 | Pres. Invent. Ex. 14 | Pres. Invent. Ex. 15 | Pres. Invent. Ex. 16 | Pres. Invent. Ex. 17 | Pres. Invent. Ex. 18 |
|---|---|---|---|---|---|---|---|
| Polishing agent molarity | Na carbonate (mol/L) | 0.018 | 0.018 | 0.018 | 0.018 | 0.018 | 0.018 |
|  | Na malate (mol/L) | 0.002 | 0.002 | 0.002 | 0.002 | 0.002 | 0.002 |
|  | Na dichloroisocyanurate (mol/L) | 0.03 | 0.03 | 0.03 | 0.03 | 0.03 | 0.03 |
|  | Na tripolyphoshate (mol/L) | 0.010 | 0.015 | 0.018 | 0.022 | 0.025 | 0.035 |

TABLE IV-continued

|  |  | Pres. Invent. Ex. 13 | Pres. Invent. Ex. 14 | Pres. Invent. Ex. 15 | Pres. Invent. Ex. 16 | Pres. Invent. Ex. 17 | Pres. Invent. Ex. 18 |
|---|---|---|---|---|---|---|---|
| Polishing characteristics | Polishing speed (μm/min) | 1.6 | 1.9 | 2.1 | 2.3 | 2.4 | 2.5 |
| Substrate properties | LPDs (defects/substrate) | 8 | 7 | 8 | 6 | 7 | 9 |
|  | HAZE (ppm) | 0.93 | 0.95 | 0.95 | 0.97 | 0.98 | 1 |
|  | Oxidation film thickness (nm) | 0.72 | 0.78 | 0.8 | 0.82 | 1 | 1.2 |
| Epi-properties | PL intensity (a.u.) | 1.3 | 1.2 | 1.1 | 1.1 | 1.1 | 1 |
| Device characteristics | Yield (%) | 49 | 52 | 53 | 54 | 51 | 50 |

Evaluation Results

As indicated in Table IV, with the compound semiconductors of Present Invention Examples 13-18, it was apparent that low LPDs and haze could be maintained, and that a high polishing rate could be maintained. Likewise, it was understood that improvement in the properties of epitaxial layers, and the properties of devices, manufactured utilizing the compound semiconductors of Present Invention Examples 13-18 was permitted.

Also, as indicated in Table IV, it was apparent that with Present Invention Examples 14-17, in which sodium tripolyphosphate having a concentration of between 0.015 mol/L and 0.025 mol/L, inclusive, was utilized, in particular, low LPDs and haze could be maintained while high polishing rates could be sustained. That is, the polishing rate with Present Invention Example 13, in which less than 0.015 mol/L sodium tripolyphosphate was used, was lower than that with Present Invention Examples 14-17. Likewise, the oxidation film thickness on Present Invention Example 18, in which sodium tripolyphosphate in excess of 0.025 mol/L was used, was greater than that on Present Invention Examples 14-17. Consequently, although the PL intensity once an epitaxial layer had been formed utilizing the compound semiconductor of Present Invention Example 18 was higher than that of Comparative Examples 1-9, it was lower than that of Present Invention Examples 14-17.

As given in the foregoing, it could be confirmed that in accordance with the present invention, for the alkali metal phosphate, utilizing sodium tripolyphosphate having a concentration of between 0.015 mol/L and 0.025 mol/L, inclusive, permitted the polishing rates to be further enhanced, and allowed the quality of the compound semiconductor faces to be more highly sustained.

Embodiment 4

In the present embodiment, the efficacy of a polishing agent with a pH of between 8.5 and 9.5, inclusive, and whose redox potential y (mV) when the pH value is given as x satisfies $-60x+1400 \leq y \leq -60x+1700$ was investigated. At the same time, the efficacy of polishing in a manner such that, letting the viscosity of the polishing agent be $\eta$ (mPa·s), the peripheral speed be V (m/s), and the applied pressure be P (kPa), the load coefficient L expressed as $\eta \times V/P$ is between $0.08 \times 10^9$ and $0.30 \times 10^{-9}$, inclusive, was investigated.

Present Invention Examples 19-28

To begin with, Si-doped GaAs substrates grown by the VB technique were prepared as compound semiconductors (Step S1).

Next, in Present Invention Examples 19 through 28, polishing agents that included sodium carbonate as the alkali metal carbonate, sodium malate as the alkali metal organic salt, sodium dichloroisocyanurate as the chlorine-based oxidizer, and sodium tripolyphosphate as the alkali metal phosphate, and wherein the sum of the concentrations of the alkali metal carbonate and the alkali metal organic salt was between 0.01 mol/L and 0.02 mol/L, inclusive, were utilized. It should be noted that as to the molarity of the polishing agent of Present Invention Example 23, the sodium carbonate was made 0.012 mol/L; the sodium malate made 0.006 mol/L; the sodium dichloroisocyanurate made 0.05 mol/L; and the sodium tripolyphosphate made 0.02 mol/L.

The polishing basically was performed in the same manner as in Present Invention Examples 1-6, but differed in that the finishing polish was made according to the polishing conditions set forth in Table V, utilizing the polishing agents just described. Substrates of 76 mm diameter and 600 μm thickness were thereby respectively created. This yielded the manufactured compound semiconductors of Present Invention Examples 19-28.

Herein, the pH of the polishing agents set forth in Table V below are values measured employing a pH/concentration meter, calibrated using pH 10.0, pH 6.9 and pH 4.0 standard buffer solutions.

Evaluation Method

In respect of the compound semiconductors of Present Invention Examples 19-28, the polishing rates (polishing speeds), oxygen concentrations, and chlorine concentrations were determined for each. The oxygen concentrations were determined by AES, and the chlorine concentrations were determined by TXRF. The results are set forth in Table V presented below.

Also, the semiconductor device yield utilizing the compound semiconductors of Present Invention Examples 19-28 were determined for each in the same way as in Embodiment 1. The results are indicated in Table V presented below.

TABLE V

|  |  | Pres. Invent. Ex. 19 | Pres. Invent. Ex. 20 | Pres. Invent. Ex. 21 | Pres. Invent. Ex. 22 | Pres. Invent. Ex. 23 | Pres. Invent. Ex. 24 | Pres. Invent. Ex. 25 | Pres. Invent. Ex. 26 | Pres. Invent. Ex. 27 | Pres. Invent. Ex. 28 |
|---|---|---|---|---|---|---|---|---|---|---|---|
| Polishing agent | pH | 9 | 9 | 9 | 9 | 9 | 9 | 9 | 9 | 9 | 9 |
|  | Potential (mV) | 750 | 860 | 860 | 950 | 1050 | 1160 | 1160 | 1210 | 1160 | 860 |

TABLE V-continued

|  |  | Pres. Invent. Ex. 19 | Pres. Invent. Ex. 20 | Pres. Invent. Ex. 21 | Pres. Invent. Ex. 22 | Pres. Invent. Ex. 23 | Pres. Invent. Ex. 24 | Pres. Invent. Ex. 25 | Pres. Invent. Ex. 26 | Pres. Invent. Ex. 27 | Pres. Invent. Ex. 28 |
|---|---|---|---|---|---|---|---|---|---|---|---|
| Polishing conditions | Load coefficient L $\eta \times V/P$ ($\times 10^{-9}$) | 0.08 | 0.05 | 0.08 | 0.12 | 0.2 | 0.30 | 0.40 | 0.30 | 0.08 | 0.30 |
|  | Viscosity (mPa·s) | 0.96 | 1 | 0.96 | 1 | 1 | 1 | 1.2 | 1 | 0.96 | 1 |
|  | Peripheral speed (m/s) | 2.5 | 1.8 | 2.5 | 3 | 4 | 4.5 | 5 | 4.5 | 2.5 | 4.5 |
|  | Pressure (kPa) | 30 | 36 | 30 | 25 | 20 | 15 | 15 | 15 | 30 | 15 |
| Polishing characteristics | Polishing speed (μm/min) | 1.6 | 1.9 | 1.7 | 1.9 | 2.2 | 2.3 | 1.3 | 2.3 | 2.5 | 1.5 |
| Substrate surface | Oxygen conc. (at %) | 3 | 4 | 4 | 5 | 10 | 12 | 12 | 16 | 12 | 4 |
|  | Chlorine conc. ($\times 10^{10}$ atoms/cm$^2$) | 120 | 60 | 120 | 200 | 1000 | 1500 | 2000 | 1500 | 120 | 1500 |
| Device characteristics | Yield (%) | 36 | 38 | 55 | 72 | 65 | 51 | 35 | 32 | 62 | 63 |

Evaluation Results

As indicated in Table V, with Present Invention Examples 20-25, 27 and 28, in which the polishing agents had a pH of between 8.5 and 9.5, inclusive, and a redox potential y (mV) when the pH value is given as x that satisfied $-60x+1400 \leq y \leq -60x+1700$, the surface oxygen concentration was between 4 atomic % and 12 atomic %, inclusive, which was within the appropriate range.

On the other hand, as for Present Invention Example 19, in which the redox potential y (mV) when the pH value is given as x was less than $-60x+1400 \leq y$, with the oxygen concentration being 3 atomic %, the oxygen concentration was low. Meanwhile, as for Present Invention Example 26, in which the redox potential y (mV) when the pH value is given as x was greater than $y \leq -60x+1700$, with the oxygen concentration being 16 atomic %, the oxygen concentration was high.

Furthermore, with Present Invention Examples 19, 21-24, and 26-28, which were polished in a manner such that, letting the viscosity of the polishing agent be η (mPa·s), the peripheral speed be V (m/s), and the applied pressure be P (kPa), the load coefficient L expressed as η×V/P was between $0.08 \times 10^{-9}$ and $0.30 \times 10^{-9}$, inclusive, the chlorine concentration was between $120 \times 10^{10}$ atoms/cm$^2$ and $1500 \times 10^{10}$ atoms/cm$^2$, inclusive, which was within the appropriate range.

On the other hand, as for Present Invention Example 20, in which the load coefficient L was less than $0.08 \times 10^9$, with the surface chlorine concentration being $60 \times 10^{10}$ atoms/cm$^2$, the chlorine concentration was low. As for Present Invention Example 25, in which the load coefficient L exceeded $0.3 \times 10^9$, with the surface chlorine concentration being $2000 \times 10^{10}$ atoms/cm$^2$, the chlorine concentration was high.

What is more, with Present Invention Examples 21-24, 27 and 28, which in the polishing step were polished in a manner such that the surface oxygen concentration would be between 4 atomic % and 12 atomic %, inclusive, and the surface chlorine concentration would be between $120 \times 10^{10}$ atoms/cm$^2$ and $1500 \times 10^{10}$ atoms/cm$^2$, inclusive, the semiconductor device yields were a high 51% and above. From these facts it will be appreciated that by making the oxygen concentration and the chlorine concentration of the compound semiconductor faces be within these ranges, the surface quality may be favorably maintained.

As given in the foregoing, it could be confirmed that in accordance with the present invention, by the polishing agent pH being between 8.5 and 9.5, inclusive, and the redox potential y (mV) when the pH value is given as x satisfying $-60x+1400 \leq y \leq -60x+1700$, the surface oxygen concentration could be controlled into a proper range.

Likewise, it could be confirmed that by polishing in a manner such that, letting the viscosity of the polishing agent be η (mPa·s), the peripheral speed be V (m/s), and the applied pressure be P (kPa), the load coefficient L expressed as η×V/P is between $0.08 \times 10^9$ and $0.30 \times 10^9$, inclusive, the surface chlorine concentration could be controlled into a proper range.

While a description of embodying modes and embodiment examples of the present invention has been undertaken in the foregoing manner, combining the features of each of the embodying modes and embodiment examples to suit is contemplated from the outset. Furthermore, the presently disclosed embodying modes and embodiment examples should in all respects be considered to be illustrative and not limiting. The scope of the present invention is set forth not by the foregoing embodying modes but by the scope of the patent claims, and is intended to include meanings equivalent to the scope of the patent claims and all modifications within the scope.

LEGEND

10: compound semiconductor; 11: face; 20: semiconductor device; 21: epitaxial layer; 22, 23: electrodes.

The invention claimed is:

1. A polishing composition for $Ga_\alpha In_{(1-\alpha)} As_\beta P_{(1-\beta)}$ ($0 \leq \alpha \leq 1$; $0 \leq \beta \leq 1$) compound semiconductors, the polishing composition being free of abrasive grains and consisting essentially of:
   a carbonate of an alkali metal;
   an organic salt of an alkali metal;
   a chlorine-based oxidizer; and
   a phosphate of an alkali metal; wherein
   the sum of the concentrations of said alkali metal carbonate and said alkali metal organic salt is between 0.01 mol/L and 0.02 mol/L, inclusive.

2. A polishing composition as set forth in claim 1, wherein:
   said alkali metal carbonate is sodium carbonate; and
   the concentration of said sodium carbonate is between 0.008 mol/L and 0.018 mol/L, inclusive.

3. A polishing composition as set forth in claim 1, wherein said alkali metal organic salt is a sodium dicarboxylate.

4. A polishing composition as set forth in claim 3, wherein said sodium dicarboxylate is at least one substance selected from the group consisting of sodium tartrate, sodium malate, and sodium succinate.

5. A polishing composition as set forth in claim 1, wherein:
   said chlorine-based oxidizer is sodium dichloroisocyanurate; and
   the concentration of said sodium dichloroisocyanurate is between 0.035 mol/L and 0.060 mol/L, inclusive.

6. A polishing composition as set forth in claim 1, wherein:
said alkali metal phosphate is sodium tripolyphosphate; and
the concentration of said sodium tripolyphosphate is between 0.015 mol/L and 0.025 mol/L, inclusive.

7. A polishing composition as set forth in claim 1, wherein:
the pH is between 8.5 and 9.5, inclusive; and
the redox potential y (mV) when the pH value is given as x satisfies $-60x+1400 \leq y \leq -60x+1700$.

8. A compound semiconductor manufacturing method comprising:
a step of preparing a $Ga_\alpha In_{(1-\alpha)} As_\beta P_{(1-\beta)}$ ($0 \leq \alpha \leq 1$; $0 \leq \beta \leq 1$) compound semiconductor; and
a step of polishing a face of the compound semiconductor utilizing the polishing composition set forth in claim 1.

9. A compound semiconductor manufacturing method as set forth in claim 8, wherein in said polishing step, the polishing is done in a manner such that, letting the viscosity of the polishing agent be η (mPa·s), the peripheral speed be V (m/s), and the applied pressure be P (kPa), the load coefficient expressed as η×V/P is between $0.08 \times 10^{-9}$ and $0.30 \times 10^{-9}$, inclusive.

10. A compound semiconductor manufacturing method as set forth in claim 8, further comprising a step of washing the compound semiconductor face following the polishing step.

11. A compound semiconductor manufacturing method as set forth in claim 10, wherein:
in said preparation step, GaAs is prepared as the compound semiconductor; and
by said polishing step and said washing step the compound semiconductor is rendered such as to have a surface oxygen concentration of between 4 atomic % and 12 atomic %, inclusive, and a surface chlorine concentration of between $120 \times 10^{10}$ atoms/cm$^2$ and $1500 \times 1010$ atoms/cm$^2$, inclusive.

12. A compound semiconductor manufacturing method as set forth in claim 10, wherein by said polishing step and said washing step, the compound semiconductor is rendered such as to have a surface sulfur concentration will be between $120 \times 10^{10}$ atoms/cm$^2$ and $1500 \times 1010$ atoms/cm$^2$, inclusive.

13. A semiconductor device manufacturing method comprising:
a step of preparing a compound semiconductor manufactured by a compound semiconductor manufacturing method as set forth in claim 8; and
a step of forming an at least singe-lamina epitaxial layer onto said compound semiconductor.

* * * * *

UNITED STATES PATENT AND TRADEMARK OFFICE
CERTIFICATE OF CORRECTION

PATENT NO. : 8,841,215 B2  Page 1 of 1
APPLICATION NO. : 13/415859
DATED : September 23, 2014
INVENTOR(S) : Keiji Ishibashi, Masashi Futamura and Takayuki Nishiura

It is certified that error appears in the above-identified patent and that said Letters Patent is hereby corrected as shown below:

In the Claims

In claim 11, $9^{th}$ line (Column 24, Line 9),
"1500×1010" should read --1500×$10^{10}$--.

In claim 12, $5^{th}$ line (Column 24, Line 15),
"1500×1010" should read --1500×$10^{10}$--.

Signed and Sealed this
Twenty-fourth Day of March, 2015

Michelle K. Lee
*Director of the United States Patent and Trademark Office*